United States Patent [19]
Weitzel et al.

[11] Patent Number: 5,661,312
[45] Date of Patent: Aug. 26, 1997

[54] SILICON CARBIDE MOSFET

[75] Inventors: Charles E. Weitzel; Mohit Bhatnagar, both of Mesa, Ariz.

[73] Assignee: Motorola, Schaumburg, Ill.

[21] Appl. No.: 413,319

[22] Filed: Mar. 30, 1995

[51] Int. Cl.$^6$ .................................................. H01L 31/0312
[52] U.S. Cl. ........................... 257/77; 257/330; 257/409
[58] Field of Search ............................. 257/76–78, 263, 257/268, 269, 278, 285, 288, 329, 77, 330, 409

[56] References Cited

U.S. PATENT DOCUMENTS

| | | | |
|---|---|---|---|
| 5,168,331 | 12/1992 | Yilmaz | 257/331 |
| 5,323,040 | 6/1994 | Baliga | 257/332 |
| 5,391,895 | 2/1995 | Dreifus | 257/77 |
| 5,393,999 | 2/1995 | Malhi | 257/77 |
| 5,396,085 | 3/1995 | Baliga | 257/77 |
| 5,451,797 | 9/1995 | Davis et al. | 257/77 |
| 5,495,124 | 2/1996 | Terashima | 257/409 |
| 5,506,421 | 4/1996 | Palmour | 257/77 |

FOREIGN PATENT DOCUMENTS

| | | | |
|---|---|---|---|
| 0418762 | 1/1992 | Japan | 257/409 |

*Primary Examiner*—Mark V. Prenty
*Attorney, Agent, or Firm*—Eugene A. Parsons

[57] ABSTRACT

A silicon carbide MOSFET (10) is formed to have a high breakdown voltage. A breakdown enhancement layer (20) is formed between a channel region (14) and a drift layer (12). The breakdown enhancement layer (20) has a lower doping concentration that increases the width of a depletion region (24) near a gate insulator (17). The increased depletion region width improves the breakdown voltage.

13 Claims, 1 Drawing Sheet

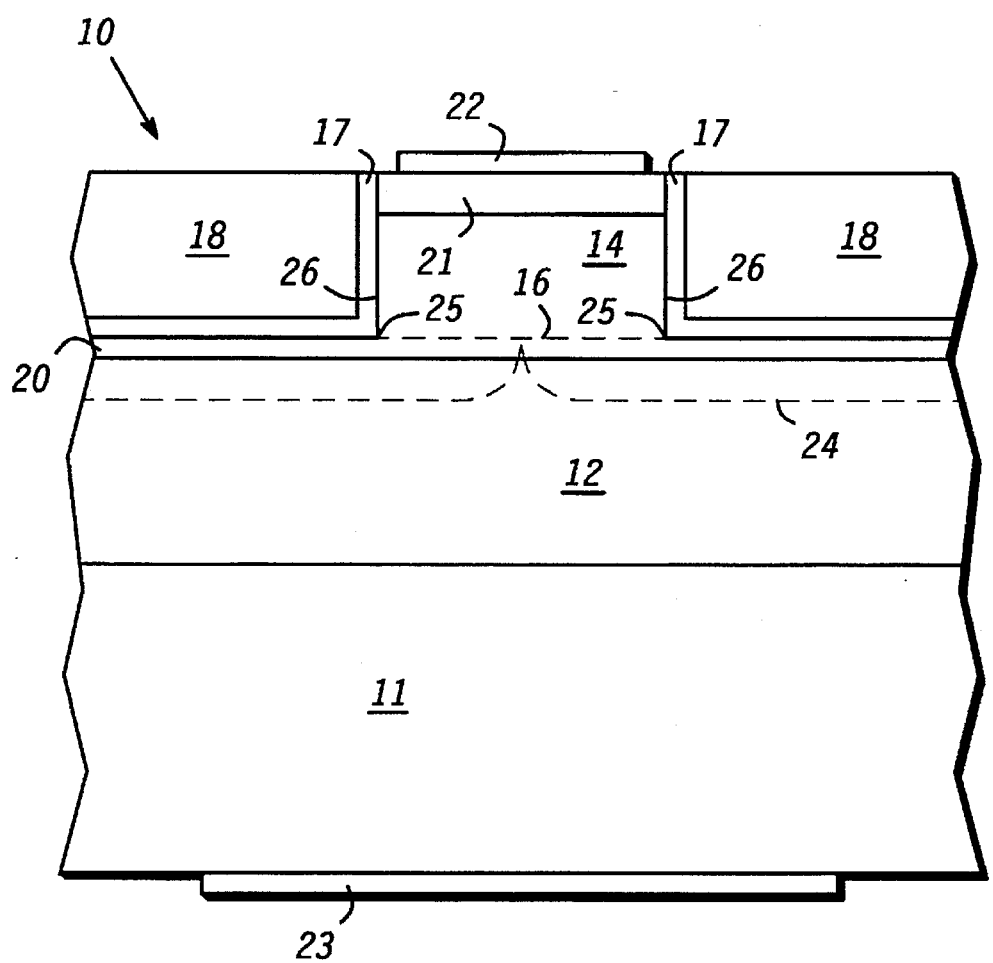

SILICON CARBIDE MOSFET

BACKGROUND OF THE INVENTION

The present invention relates, in general, to semiconductor devices, and more particularly, to a novel metal oxide semiconductor field effect transistor.

In the past, the semiconductor industry has utilized a variety of structures to improve the breakdown voltage of power metal oxide semiconductor field effect transistors (MOSFETs). One particular implementation involves forming a lightly doped epitaxial drift layer on a heavily doped substrate. A second lightly doped layer is formed on the lightly doped drift layer. Trenches are etched completely through the second lightly doped layer and into the drift layer. A gate is created by forming an oxide on the sidewalls of the trenches and filling the trenches with gate material. Because the gate is adjacent the second lightly doped layer and the drift layer, the channel of the MOSFET includes both the second lightly doped layer and a portion of the drift layer. A source region is formed on the second lightly doped layer. One example of such a MOSFET is described in U.S. Pat. No. 5,323,040 issued to Baliga et al. on Jun. 21, 1994.

One problem with this prior implementation is the gate-to-drain breakdown voltage. Breakdown generally occurs near the corners of the oxide that is lining the trench. Consequently, the gate-to-drain breakdown voltage of the MOSFET is not as great as desired.

Accordingly, it is desirable to have a power MOSFET that does not have breakdown near the corners of the gate oxide, and that has a large gate-to-drain breakdown voltage.

BRIEF DESCRIPTION OF THE DRAWING

The sole FIGURE illustrates an enlarged cross-sectional portion of a MOSFET in accordance with the present invention.

DETAILED DESCRIPTION OF THE DRAWINGS

The sole FIGURE illustrates a cross-sectional portion of a vertical metal oxide semiconductor field effect transistor (MOSFET) 10 that has a high breakdown voltage. Transistor 10 includes a heavily doped N-type silicon carbide substrate 11 and a lightly doped N-type drift layer 12 that can be epitaxially formed on substrate 11. As will be seen hereinafter, a breakdown enhancement layer 20 on layer 12 is used to improve the gate-to-drain breakdown voltage of transistor 10. Layer 20 is N-type material that is doped lighter that layer 12. Transistor 10 also includes a very lightly doped N-type channel region 14 that is on layer 20, and is formed into a mesa extending above a surface of layer 20. A gate insulator 17, for example silicon dioxide, is formed along sidewalls 26 of region 14 and on the surface of layer 20 adjacent to region 14. Region 14 is the area between gate insulators 17, and has a lower boundary as indicated by a dashed line 16.

A gate material is formed on insulator 17 in order to form gates 18. The material used for gates 18 is selected to have a work function that is sufficiently high to create a depletion region 24, illustrated by a dashed line, that substantially prevents current flow through channel region 14. For example, the gate material can be very heavily doped P-type material such as silicon carbide, diamond, aluminum nitride, or gallium nitride. The heavy doping increases the work function of the material used for gates 18 and increases the width of depletion region 24, thereby facilitating use of a wider region 14. A gate electrode (not shown) typically is formed on the gate material to provide electrical contact to gates 18. Additionally, a source contact 21 is formed on channel region 14 in order to provide ohmic contact to a source electrode 22 that is on contact 21, and a drain electrode 23 is formed on a bottom surface of substrate 11.

In order to provide transistor 10 with a high gate-to-drain breakdown voltage, it is important that breakdown enhancement layer 20 extend underneath or underlie corners 25 of insulator 17. When a reversed bias is applied between gate 18 and drain electrode 23, a large electric field is created near corners 25 that can adversely affect the breakdown voltage of transistor 10. The very light doping within breakdown enhancement layer 20 results in increasing the width of depletion region 24 near corners 25 thereby increasing the gate-to-drain breakdown voltage of transistor 10.

For example, for a transistor 10 having a drift layer doping of approximately $4 \times 10^{16}$, a breakdown enhancement layer doping of approximately $1 \times 10^{16}$, and a channel region doping of approximately $3 \times 10^{15}$, a gate-to-drain breakdown voltage is achieved that is at least approximately two times greater than a prior art MOSFET that does not utilize layer 20. Such prior art MOSFETs typically have a higher doping concentration in the portion of the channel region near the bottom of the gate insulator.

Layer 20 and region 14 can have the same doping concentration or layer 20 can have a doping concentration that is higher than that of region 14 but lower than that of layer 12. In the preferred embodiment, layer 20 and region 14 have the same doping concentration, and layer 20 is approximately two hundred to three hundred nanometers thick under corners 25. Channel region 14 and layer 20 can be formed by a variety of techniques that are well known to those skilled in the semiconductor art. For example, layer 20 can be epitaxially formed on layer 12, and region 14 can be epitaxially formed as a uniform layer on layer 20 and thereafter formed into a mesa as shown in the sole FIGURE. Alternately, layer 12 can be formed to have a uniform thickness that includes the thickness of layer 20, region 14, and contact 21. Then, a mask can be utilized to implant a light P-type doping in the portion where layer 20 and region 14 are to be formed. This light P-type doping reduces the N-type doping in the portion of layer 12 that will become layer 20 and region 14. Thereafter, adjacent portions of layer 12 can be removed, for example by reactive ion etching, to form region 14 extending above the surface of layer 20.

By now, it should be appreciated there has been provided a novel vertical MOSFET having a high breakdown voltage. By forming a lightly doped breakdown enhancement layer under the gate insulator and the corners formed by the gate insulator, the gate-to-drain breakdown voltage of the transistor is increased by at least approximately two times.

We claim:

1. A silicon carbide MOSFET comprising:
   a silicon carbide substrate of a first conductivity type having a first doping concentration;
   a drift layer on the substrate wherein the drift layer has the first conductivity type and a second doping concentration that is less than the first doping concentration;
   a breakdown enhancement layer on the drift layer, the breakdown enhancement layer having a surface, the first conductivity type, and a third doping concentration that is less than the second doping concentration;
   a channel region on the breakdown enhancement layer and extending above the surface of the breakdown enhancement layer, the channel region having the first conductivity type and a fourth doping concentration that is less than the second doping concentration;

a gate insulator on a side of the channel region wherein the gate insulator has an interface with the breakdown enhancement layer; and a gate material on the gate insulator, the gate material having a work function that forms a depletion region having a width sufficient to substantially prevent current flow through the channel region, and a fifth doping concentration that is greater than the second doping concentration and a second conductivity type.

2. The silicon carbide MOSFET of claim 1 wherein the gate material is one of silicon carbide, diamond or aluminum nitride or gallium nitride.

3. The silicon carbide MOSFET of claim 1 further including a source contact on the channel region adjacent to the gate insulator.

4. The silicon carbide MOSFET of claim 1 wherein the fourth doping concentration is approximately equal to the third doping concentration.

5. A MOSFET comprising:

a channel region of a first conductivity type having a first doping concentration;

a gate positioned adjacent a side of the channel region;

a gate insulator on the channel region between the gate and the channel region and beneath the gate;

a breakdown enhancement layer underlying the gate insulator and the side of the channel region, the breakdown enhancement layer having the first conductivity type and a second doping concentration that is no less than the first doping concentration; and a drift layer underlying the breakdown enhancement layer, the drift layer having the first conductivity type and a third doping concentration that is greater than the first and the second doping concentration.

6. The MOSFET of claim 5 wherein the second doping concentration is greater than the first doping concentration.

7. The MOSFET of claim 5 wherein a portion of the gate insulator is on the breakdown enhancement layer.

8. The MOSFET of claim 5 further including a gate material on the gate insulator, the gate material having a second conductivity type and a work function that is sufficiently large to substantially prevent current flow through the channel region.

9. The MOSFET of claim 8 wherein the gate material has a fourth doping concentration that is greater than the third doping concentration.

10. The MOSFET of claim 8 wherein the gate material is one of silicon carbide, aluminum nitride, gallium nitride, or diamond.

11. The MOSFET of claim 5 wherein the channel region extends from the breakdown enhancement layer above a surface of the breakdown enhancement layer.

12. The MOSFET of claim 5 further including a silicon carbide substrate of the first conductivity type and a fourth doping concentration that is greater than the third doping concentration wherein the drift layer is on the silicon carbide substrate.

13. A silicon carbide MOSFET comprising:

a silicon carbide substrate of a first conductivity type having a first doping concentration;

a drift layer on the substrate wherein the drift layer has the first conductivity type and a second doping concentration that is less than the first doping concentration;

a breakdown enhancement layer on the drift layer, the breakdown enhancement layer having a surface, the first conductivity type, and a third doping concentration that is less than the second doping concentration;

a channel region on the breakdown enhancement layer and extending above the surface of the breakdown enhancement layer, the channel region having the first conductivity type and a fourth doping concentration that is less than the second doping concentration;

a gate insulator on a side of the channel region and overlying a portion of the breakdown enhancement layer, wherein the gate insulator forms an interface with the breakdown enhancement layer; and a gate material positioned on the gate insulator adjacent the channel region and overlying the portion of the breakdown enhancement layer;

wherein the fourth doping concentration is no greater than the third doping concentration.

* * * * *